United States Patent
Zou et al.

(10) Patent No.: US 12,261,465 B2
(45) Date of Patent: Mar. 25, 2025

(54) BATTERY EQUALIZATION METHOD AND DEVICE, AND BATTERY MANAGEMENT SYSTEM WITH CLOSED CIRCUIT VOLTAGE MEASUREMENTS OBTAINED BY CHARGING AND DISCHARGING PLUSES

(71) Applicant: JIANGSU CONTEMPORARY AMPEREX TECHNOLOGY LIMITED, Changzhou (CN)

(72) Inventors: Qifan Zou, Zhangzhou (CN); Li Tan, Ningde (CN); Chenlin Yang, Zhangzhou (CN)

(73) Assignee: JIANGSU CONTEMPORARY AMPEREX TECHNOLOGY LIMITED, Changzhou (CN)

( * ) Notice: Subject to any disclaimer, the term of this patent is extended or adjusted under 35 U.S.C. 154(b) by 0 days.

(21) Appl. No.: 17/938,149

(22) Filed: Oct. 5, 2022

(65) Prior Publication Data
US 2023/0046587 A1     Feb. 16, 2023

Related U.S. Application Data

(63) Continuation of application No. PCT/CN2021/079832, filed on Mar. 9, 2021.

(30) Foreign Application Priority Data

Dec. 23, 2020  (CN) ............... 202011539345.6

(51) Int. Cl.
*H02J 7/00* (2006.01)
*G01R 31/382* (2019.01)
*H01M 10/42* (2006.01)

(52) U.S. Cl.
CPC .......... *H02J 7/0016* (2013.01); *G01R 31/382* (2019.01); *H01M 10/425* (2013.01); *H02J 7/0048* (2020.01); *H02J 7/00711* (2020.01); *H01M 2010/4271* (2013.01)

(58) Field of Classification Search
CPC ............. G01R 31/382; H01M 10/425; H01M 2010/4271; H02J 7/0048; H02J 7/00711;
(Continued)

(56) References Cited

U.S. PATENT DOCUMENTS 3,886,427 A  *  5/1975  Long ................... H02J 7/00302
                                                    320/156
4,385,269 A  *  5/1983  Aspinwall ......... H02J 7/007184
                                                    320/152
(Continued)

FOREIGN PATENT DOCUMENTS

CN     101316048 A    12/2008
CN     106300545 A     1/2017
(Continued)

OTHER PUBLICATIONS

Translation of CN101316048A, Irina Knizhnik, translated Feb. 6, 2023 (Year: 2023).*
(Continued)

*Primary Examiner* — John T Trischler
(74) *Attorney, Agent, or Firm* — Kilpatrick Townsend & Stockton LLP

(57) ABSTRACT

This application describes a battery equalization method and device, and a battery management system. The battery equalization method includes: obtaining a first closed circuit voltage of N cells in a duration of a pulse charge current and a second closed circuit voltage of the N cells in a duration of a pulse discharge current, where the N cells constitute a battery, and N is a positive integer; determining a relationship of SOC values between the N cells based on the first closed circuit voltage and the second closed circuit voltage; and performing charge equalization on target cells, where the target cells are determined from the N cells based on the relationship of SOC values.

10 Claims, 3 Drawing Sheets

---

310: Obtaining a first closed circuit voltage of each of N cells in a duration of a pulse charge current, and a second closed circuit voltage of each of the N cells in a duration of a pulse discharge current, wherein the N cells constitute a battery, and N is a positive integer

↓

320a: determining relationships of state of charge (SOC) values among the N cells based on first closed circuit voltages of the N cells and second closed circuit voltages of the N cells

↓

320b: determining target cells from the N cells based on the relationships of the state of charge (SOC) values among the N cells

↓

330: performing charge equalization on the target cells of the N cells

(58) Field of Classification Search
CPC ...... H02J 7/0014; H02J 7/0016; H02J 7/0018; H02J 7/0019; B60L 11/1866; B60L 58/22
USPC ........................................................ 320/116
See application file for complete search history.

(56) References Cited

U.S. PATENT DOCUMENTS

| | | | | |
|---|---|---|---|---|
| 5,694,023 A * | 12/1997 | Podrazhansky | ...... | H02J 7/00711 320/132 |
| 5,905,360 A * | 5/1999 | Ukita | .................. | H02J 7/0014 320/121 |
| 5,998,968 A * | 12/1999 | Pittman | ................ | H02J 7/00711 320/145 |
| 6,271,645 B1 * | 8/2001 | Schneider | .............. | B60L 58/12 320/118 |
| 7,126,312 B2 * | 10/2006 | Moore | .................. | H02J 7/0016 320/157 |
| 7,193,392 B2 | 3/2007 | King et al. | | |
| 7,245,108 B2 * | 7/2007 | Chertok | .................. | B60L 58/18 320/132 |
| 7,378,818 B2 * | 5/2008 | Fowler | .................. | H01M 10/441 320/108 |
| 8,198,862 B2 * | 6/2012 | Zhang | .................... | B60L 58/22 320/118 |
| 8,242,745 B2 * | 8/2012 | Zhang | .................... | B60L 58/22 320/120 |
| 8,253,378 B2 * | 8/2012 | Lee | ...................... | H02J 7/0047 320/118 |
| 8,330,418 B2 * | 12/2012 | Furukawa | ............. | H02J 7/0018 320/118 |
| 8,643,334 B2 * | 2/2014 | Kuo | ...................... | H02J 7/0019 320/122 |
| 8,846,224 B2 * | 9/2014 | Paulsen | ............... | H01M 10/441 429/231.95 |
| 8,980,484 B2 * | 3/2015 | Chang | .................... | H01M 8/20 429/400 |
| 9,455,580 B2 * | 9/2016 | Mao | ....................... | H02J 7/0016 |
| 9,728,820 B2 * | 8/2017 | Diamond | ............ | H01M 10/441 |
| 10,008,865 B2 * | 6/2018 | Hempel | ............... | H02J 7/00711 |
| 10,131,238 B2 * | 11/2018 | Ricci | ....................... | B60L 53/39 |
| 10,141,751 B2 * | 11/2018 | Arita | ......................... | H02J 5/00 |
| 10,338,149 B2 * | 7/2019 | Tan | ....................... | G01R 31/3646 |
| 10,424,961 B1 * | 9/2019 | Maluf | ................... | H02J 7/00041 |
| 10,690,725 B2 * | 6/2020 | Diamond | ............ | G01R 31/3835 |
| 10,761,141 B2 * | 9/2020 | Song | .................... | G01R 31/3828 |
| 10,938,221 B1 * | 3/2021 | Tenorio | ................. | H02J 7/0048 |
| 10,944,273 B2 * | 3/2021 | Lee | ........................ | B60L 58/21 |
| 10,944,278 B1 * | 3/2021 | Kang | ..................... | H02J 7/00712 |
| 10,944,279 B1 * | 3/2021 | Chen | ..................... | H02J 7/0047 |
| 10,992,155 B2 * | 4/2021 | Shih | ..................... | H02J 7/0013 |
| 11,095,140 B1 * | 8/2021 | Chen | ..................... | H02J 7/0047 |
| 11,095,143 B2 * | 8/2021 | Akaishi | ............... | G01R 31/3842 |
| 11,101,677 B2 * | 8/2021 | Shih | ..................... | H02J 7/0071 |
| 11,133,690 B1 * | 9/2021 | Chen | ..................... | H02J 7/0063 |
| 11,509,144 B2 * | 11/2022 | Liu | ........................ | H02J 7/00304 |
| 11,699,908 B2 * | 7/2023 | Chen | ..................... | H01M 10/425 320/112 |
| 11,817,723 B2 * | 11/2023 | Liu | ....................... | H02J 7/0063 |
| 12,113,378 B2 * | 10/2024 | Liu | ...................... | H02J 7/00712 |
| 2001/0028238 A1 * | 10/2001 | Nakamura | ........ | H01M 10/4242 320/132 |
| 2004/0135544 A1 * | 7/2004 | King | ....................... | B60L 58/18 320/116 |
| 2004/0135545 A1 * | 7/2004 | Fowler | ............... | H01M 10/441 320/118 |
| 2004/0135546 A1 * | 7/2004 | Chertok | ................. | B60L 58/18 320/118 |
| 2004/0177282 A1 * | 9/2004 | Twu | ..................... | H02J 7/0014 713/300 |
| 2006/0022639 A1 * | 2/2006 | Moore | ................... | H02J 7/0016 320/116 |
| 2006/0043934 A1 * | 3/2006 | Sugimoto | ............. | H02J 7/0016 320/132 |
| 2006/0097698 A1 * | 5/2006 | Plett | ....................... | H02J 7/0048 320/118 |
| 2006/0204849 A1 * | 9/2006 | Saito | ................... | H01M 4/1391 429/223 |
| 2007/0080664 A1 * | 4/2007 | Maguire | ............... | H02J 7/0014 320/116 |
| 2008/0100265 A1 * | 5/2008 | Lim | ....................... | H02J 7/00711 320/134 |
| 2008/0191663 A1 * | 8/2008 | Fowler | .................. | H02J 7/0018 320/118 |
| 2010/0013439 A1 * | 1/2010 | Altman | ................ | H02J 7/00711 320/139 |
| 2010/0085009 A1 * | 4/2010 | Kang | .................... | H02J 7/0019 324/427 |
| 2010/0231166 A1 * | 9/2010 | Lee | ....................... | H02J 7/0018 320/118 |
| 2011/0057617 A1 * | 3/2011 | Finberg | ................. | H02J 7/0016 320/122 |
| 2011/0089897 A1 * | 4/2011 | Zhang | .................. | H02J 7/0016 320/116 |
| 2011/0140650 A1 * | 6/2011 | Zhang | .................. | H02J 7/0016 320/118 |
| 2012/0133333 A1 * | 5/2012 | Morioka | ............... | H02J 7/0049 320/134 |
| 2012/0256569 A1 * | 10/2012 | Kawahara | ......... | H01M 10/6563 374/142 |
| 2012/0262121 A1 * | 10/2012 | Kuo | ...................... | H02J 7/0019 320/128 |
| 2012/0290234 A1 * | 11/2012 | Schaefer | ................. | H02J 7/04 320/135 |
| 2013/0084506 A1 * | 4/2013 | Chang | ................... | H02J 7/0042 324/432 |
| 2013/0106356 A1 * | 5/2013 | Nakao | ................... | H01M 10/48 320/118 |
| 2013/0241567 A1 * | 9/2013 | Boehm | .................. | B60L 50/52 324/434 |
| 2013/0257323 A1 * | 10/2013 | Diamond | ................ | B60L 58/22 320/118 |
| 2013/0257377 A1 * | 10/2013 | Diamond | ............ | G01R 31/3835 320/118 |
| 2013/0257381 A1 * | 10/2013 | Diamond | ................ | B60L 58/12 320/136 |
| 2014/0361732 A1 * | 12/2014 | Nishikawa | ................ | H02J 7/00 320/107 |
| 2015/0035490 A1 * | 2/2015 | Mao | ..................... | H02J 7/0019 320/120 |
| 2015/0155727 A1 * | 6/2015 | Chang | ................... | H01M 8/188 324/426 |
| 2018/0106866 A1 * | 4/2018 | Tan | .................... | H01M 10/4257 |
| 2018/0136283 A1 * | 5/2018 | Song | ................. | G01R 31/3828 |
| 2018/0226905 A1 * | 8/2018 | Botts | ........................ | B60L 58/19 |
| 2019/0072618 A1 * | 3/2019 | Ghantous | ............ | G01R 31/392 |
| 2019/0097433 A1 * | 3/2019 | Zou | ...................... | H02J 7/007192 |
| 2019/0120910 A1 * | 4/2019 | Ghantous | ............... | H01M 10/44 |
| 2019/0207393 A1 * | 7/2019 | Shih | ....................... | H02J 7/0013 |
| 2019/0207398 A1 * | 7/2019 | Shih | ....................... | H02J 7/0071 |
| 2019/0379092 A1 * | 12/2019 | Schiffer | ............. | G01R 31/3835 |
| 2020/0185934 A1 * | 6/2020 | Zavodny | ................. | H02J 7/0019 |
| 2020/0235588 A1 * | 7/2020 | Lee | ....................... | H01M 10/425 |
| 2020/0280203 A1 * | 9/2020 | Sherstyuk | ............ | H02J 7/00711 |
| 2021/0031646 A1 * | 2/2021 | Kim | ........................ | B60L 58/16 |
| 2021/0098998 A1 * | 4/2021 | Eo | ....................... | G01R 31/3835 |
| 2021/0376629 A1 * | 12/2021 | Chen | ...................... | H02J 1/001 |
| 2022/0109309 A1 * | 4/2022 | Liu | ....................... | H02J 7/00304 |
| 2022/0209563 A1 * | 6/2022 | Sherstyuk | ........... | H02J 7/007184 |
| 2022/0231515 A1 * | 7/2022 | Bae | ....................... | H01M 10/42 |
| 2022/0236333 A1 * | 7/2022 | Liu | ...................... | G01R 31/392 |
| 2022/0329098 A1 * | 10/2022 | Sherstyuk | ............ | H02J 7/00711 |
| 2023/0387696 A1 * | 11/2023 | Liu | ........................ | H02J 7/007 |

FOREIGN PATENT DOCUMENTS

| | | |
|---|---|---|
| CN | 106786909 A | 5/2017 |
| CN | 110515011 A | 11/2019 |
| CN | 111614139 A | 9/2020 |

(56) References Cited

FOREIGN PATENT DOCUMENTS

CN    112260372 A    1/2021
WO    2020087161 A1  5/2020

OTHER PUBLICATIONS

First Office Action of Chinese Patent Application No. 202011539345.6, dated Feb. 1, 2021.
International Search Report for Application No. PCT/CN2021/079832, dated Sep. 23, 2021.
Written Opinion for International Application No. PCT/CN2021/079832, dated Sep. 23, 2021.
Notification to Grant Patent Right for Invention of Application CN 202011539345.6, dated Feb. 18, 2021.
First Search Report of Application CN 202011539345.6, dated Jan. 27, 2021.
The communication pursuant to Article 94(2) EPC received in the corresponding European Application 21904633.1, mailed Jul. 11, 2023, 5 pages.
The European search report received in the corresponding European Application 21904633.1, mailed Jun. 29, 2023, 3 pages.

* cited by examiner

BATTERY EQUALIZATION METHOD AND DEVICE, AND BATTERY MANAGEMENT SYSTEM WITH CLOSED CIRCUIT VOLTAGE MEASUREMENTS OBTAINED BY CHARGING AND DISCHARGING PLUSES

CROSS-REFERENCE TO RELATED APPLICATIONS

This application is a continuation of International Patent Application No. PCT/CN2021/079832, filed on Mar. 9, 2021, which claims priority to Chinese Patent Application No. 202011539345.6, filed on Dec. 23, 2020. The aforementioned patent applications are incorporated herein by reference in their entirety.

TECHNICAL FIELD

This application relates to the technical field of batteries, and in particular, to a battery equalization method and device, and a battery management system.

BACKGROUND

When a plurality of cells are serial-parallel-connected to form a battery, due to inhomogeneity and individual differences between the cells in the battery, a state of charge (SOC) is generally not exactly identical between the plurality of cells, and the remaining charge differs between the cells, thereby resulting in inequality of the battery. This greatly affects exertion of a capacity of the battery and decreases a service life of the battery. Therefore, the battery needs to be equalized. In some circumstances, a specific value of the SOC of each cell is generally estimated by detecting an open circuit voltage of the cell, and then the SOC of the battery is equalized based on the value.

However, due to a small difference in the open circuit voltage between the cells of different SOC values, the estimated SOC value is not precise enough. Consequently, the degree of inequality between the cells is likely to be determined erroneously, and the equalization effect is likely to be unsatisfactory.

SUMMARY

An objective of embodiments of this application is to provide a battery equalization method and device, and a battery management system to mitigate the foregoing problems.

To implement the foregoing objective, this application provides the following technical solution:

According to a first aspect, an embodiment of this application provides a battery equalization method. The method includes: obtaining a first closed circuit voltage of N cells in a duration of a pulse charge current and a second closed circuit voltage of the N cells in a duration of a pulse discharge current, where the N cells constitute a battery, and N is a positive integer; determining a relationship of state of charge (SOC) values between the N cells based on the first closed circuit voltage and the second closed circuit voltage; and performing charge equalization on target cells, where the target cells are determined from the N cells based on the relationship of SOC values.

In the foregoing solution, the relationship of SOC values between the cells is obtained based on the first closed circuit voltage and the second closed circuit voltage of the N cells that constitute the battery. An absolute SOC value of each cell does not need to be obtained precisely, and a specific percentage of SOC difference between the cells does not need to be obtained. The computation load is small, and it is not difficult to determine a SOC. Moreover, when a current exists, the closed circuit voltage may differ greatly between the cells. Therefore, by determining the relationship of SOC values between the N cells based on both the first closed circuit voltage at the time of pulse charge and the second closed circuit voltage at the time of pulse discharge, the degree of inequality between the cells can be identified simply and accurately, and the equalization effect is good.

In an optional implementation, a manner of determining the relationship of SOC values between any two cells includes: determining, if the first closed circuit voltage of a first cell in two cells is greater than the first closed circuit voltage of a second cell in the two cells, and the second closed circuit voltage of the first cell is also greater than the second closed circuit voltage of the second cell, that a SOC value of the first cell is greater than a SOC value of the second cell.

When pulse charge or pulse discharge occurs, both the first closed circuit voltage and the second closed circuit voltage of a cell with a high SOC value are relatively high. Therefore, by collecting the first closed circuit voltage at the time of pulse charge and the second closed circuit voltage at the time of pulse discharge and comparing the first closed circuit voltage and the second closed circuit voltage between the two cells, interference of an internal resistance on the SOC can be precluded, and a high-SOC cell and a low-SOC cell in two cells can be identified.

In an optional implementation, the determining a relationship of state of charge (SOC) values between the N cells based on the first closed circuit voltage and the second closed circuit voltage includes: determining M SOC values from the SOC values of the N cells based on the first closed circuit voltage and the second closed circuit voltage of each cell, where the M SOC values are not less than any of remaining SOC values other than the M SOC values in the SOC values of the N cells, and the target cells include the M cells corresponding to the M SOC values; and/or determining L SOC values from the SOC values of the N cells based on the first closed circuit voltage and the second closed circuit voltage of each cell, where the L SOC values are not greater than any of remaining SOC values other than the L SOC values in the SOC values of the N cells, and the target cells include the L cells corresponding to the L SOC values, where M and L are positive integers, M is less than N, and L is less than N.

In an optional implementation, the determining a relationship of state of charge (SOC) values between the N cells based on the first closed circuit voltage and the second closed circuit voltage includes: determining a SOC ranking of the N cells based on the first closed circuit voltage and the second closed circuit voltage of each cell, where the target cells include: M cells corresponding to the M SOC values that are ranked first in the SOC ranking and/or L cells corresponding to the L SOC values that are ranked last in the SOC ranking.

In an optional implementation, the performing charge equalization on target cells includes: performing equalization on the target cells in a preset amount of charge.

The amount of charge in which each target cell is equalized is preset, thereby ensuring that the remaining charge is as consistent as practicable between the N cells when a precise SOC value of each cell is not available. By presetting a reasonable amount of charge, it is ensured that each cell will not be discharged excessively at a time, and that the remaining charge will not be unequal again between the N cells.

In an optional implementation, the obtaining a first closed circuit voltage of N cells in a duration of a pulse charge current and a second closed circuit voltage of the N cells in a duration of a pulse discharge current includes: obtaining, when a trigger condition is satisfied, the first closed circuit voltage of the N cells in the duration of the pulse charge current and the second closed circuit voltage of the N cells in the duration of the pulse discharge current, where the trigger condition includes at least one of the following conditions: a preset duration has passed since a previous charge equalization process; a pulse charge current and a pulse discharge current appear consecutively; and the pulse charge current and the pulse discharge current appear in a preset time interval.

In an optional implementation, the obtaining a first closed circuit voltage of N cells in a duration of a pulse charge current and a second closed circuit voltage of the N cells in a duration of a pulse discharge current includes: obtaining a first closed circuit voltage of each cell in a duration of a latest pulse charge current and a second closed circuit voltage of the cell in a duration of a latest pulse discharge current.

In an optional implementation, the obtaining a first closed circuit voltage of N cells in a duration of a pulse charge current and a second closed circuit voltage of the N cells in a duration of a pulse discharge current includes: determining a target pulse charge current of a largest charge current value and a target pulse discharge current of a largest discharge current value among latest j pulse charge currents and latest k pulse discharge currents; and obtaining the first closed circuit voltage of each cell in a duration of the target pulse charge current and the second closed circuit voltage of the cell in a duration of the target pulse discharge current.

The pulse charge current of the largest current value and the pulse discharge current of the largest current value are selected. Therefore, in a case of a high current value, the difference of the closed circuit voltage between different cells can be amplified, so that it is easier to identify the relationship of SOC values between the cells.

In an optional implementation, the first closed circuit voltage is a highest voltage of the cells in the duration of the pulse charge current, and the second closed circuit voltage is a lowest voltage of the cells in the duration of the pulse discharge current.

The highest voltage and the lowest voltage are a peak voltage during pulse charge and a peak voltage during pulse discharge, respectively. The peak voltages are used as a basis for determining the relationship of SOC values, thereby further amplifying the voltage difference between the cells, and then amplifying the SOC difference between the cells, and making it easier to identify the relationship of SOC values.

According to a second aspect, an embodiment of this application provides a battery equalization device. The device includes: a voltage obtaining module, configured to obtain a first closed circuit voltage of N cells in a duration of a pulse charge current and a second closed circuit voltage of the N cells in a duration of a pulse discharge current, where the N cells constitute a battery, and N is a positive integer; a SOC comparison module, configured to determine a relationship of state of charge (SOC) values between the N cells based on the first closed circuit voltage and the second closed circuit voltage; and an equalization control module, configured to perform charge equalization on target cells, where the target cells are determined from the N cells based on the relationship of SOC values.

According to a third aspect, an embodiment of this application provides a battery management system, including: a plurality of collection units, each configured to collect a first closed circuit voltage of a corresponding cell in a battery in a duration of a pulse charge current, and a second closed circuit voltage of the cell in a duration of a pulse discharge current; a plurality of equalization units, each configured to perform charge equalization on the corresponding cell in the battery; a battery management and control unit, connected to each collection unit and each equalization unit, and configured to perform the battery equalization method according to the first aspect or any optional implementation of the first aspect.

BRIEF DESCRIPTION OF DRAWINGS

To describe the technical solutions in the embodiments of this application more clearly, the following outlines the drawings used in the embodiments of this application. Evidently, the drawings outlined below are merely a part of embodiments of this application. A person of ordinary skill in the art may derive other drawings from the outlined drawings without making any creative efforts.

Figure 1:
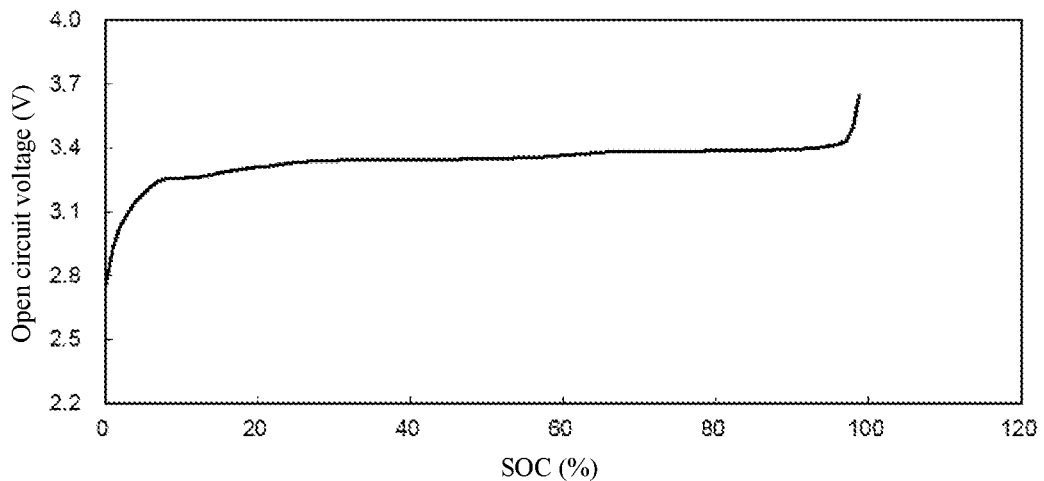
FIG. 1 shows a charge characteristics curve of a lithium-ion cell that uses lithium iron phosphate as a positive electrode material.

The drawings are not drawn to scale.

DETAILED DESCRIPTION

The following gives a more detailed description of implementations of this application with reference to accompanying drawings and embodiments. The detailed description of the following embodiments and the accompanying drawings are intended to exemplarily describe the principles of this application, but not to limit the scope of this application. Therefore, this application is not limited to the described embodiments.

In the description of this application, unless otherwise specified, "a plurality of" means two or more; the terms such as "upper", "lower", "left", "right", "inner", and "outer" indicating a direction or a position relationship are merely intended for ease or brevity of description of this application, but do not indicate or imply that the device or component referred to must be located in the specified direction or constructed or operated in the specified direction. Therefore, such terms shall not be understood as a limitation on this application. In addition, the terms "first", "second", and "third" are merely intended for descriptive purposes, but are not intended to indicate or imply relative importance. "Perpendicular" is not exactly perpendicular, but within an error tolerance range. "Parallel" is not exactly parallel, but within an error tolerance range.

The directional terms appearing in the following description indicate the directions shown in the drawings, but are not intended to limit specific structures in this application. In the context of this application, unless otherwise expressly specified, the terms "mount", "concatenate", and "connect" are understood in a broad sense. For example, a "connection" may be a fixed connection, a detachable connection, or an integrated connection, and may be a direct connection or an indirect connection implemented through an intermediary. A person of ordinary skill in the art can understand the specific meanings of the terms in this application according to specific situations.

Figure 2:
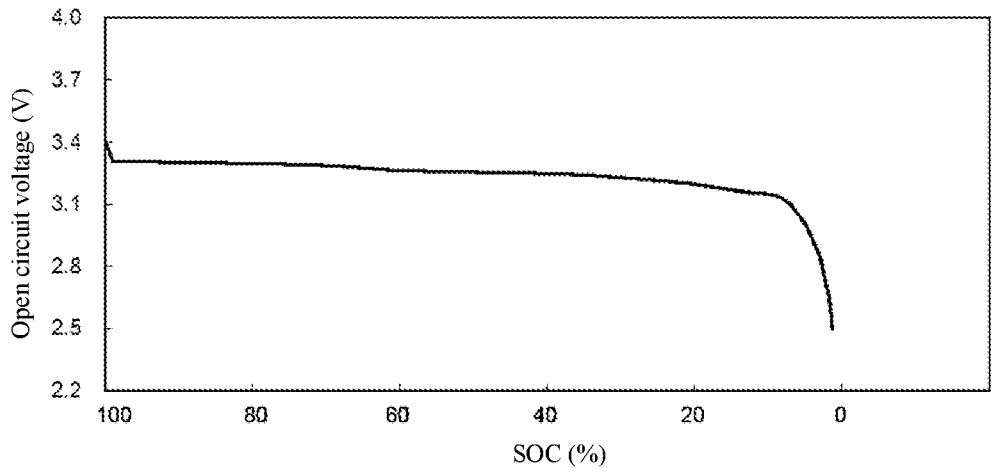
FIG. 2 shows a discharge characteristics curve of a lithium-ion cell that uses lithium iron phosphate as a positive electrode material.

In some circumstances, a specific value of the SOC of each cell is estimated by detecting an open circuit voltage of the cell, and then each cell is charged or discharged in a corresponding amount based on the value, so as to equalize the SOC of the battery. This practice incurs the following problems: First, after the open circuit voltage is obtained, the specific value of SOC needs to be calculated by using various complicated formulas, and the computation load is heavy; second, as shown in FIG. 1, which shows a charge characteristics curve of a lithium-ion cell that uses lithium iron phosphate as a positive electrode material, and as shown in FIG. 2, which shows a discharge characteristics curve of a lithium-ion cell that uses lithium iron phosphate as a positive electrode material, as can be seen from the two curves that exhibit a relationship between an open circuit voltage across the cell and the SOC, a charge voltage plateau and a discharge voltage plateau of the lithium-ion cell are very flat, and the difference in the open circuit voltage is very small between the cells with different SOC values, the SOC estimated by using the open circuit voltage is not precise at all. Consequently, the degree of inequality between the cells is likely to be determined incorrectly, and the equalization effect is likely to be unsatisfactory.

In addition, when the SOC is estimated by using the open circuit voltage, the estimation is inevitably affected by interference from a direct-current internal resistance of the cell. Inconsistency of the direct-current internal resistance interferes with measurement of the open circuit voltage, and thereby affects the result of the estimated SOC. This further reduces precision of the estimated SOC.

Considering that the charge voltage plateau and the discharge voltage plateau of the lithium-ion battery are relatively flat, the SOC of each cell can hardly be estimated precisely by measuring the open circuit voltage. Therefore, the degree of inequality between the cells can hardly be determined precisely. An embodiment of this application provides a battery equalization method to easily identify the degree of inequality between the cells without a need to calculate the specific value of SOC.

Figure 3:
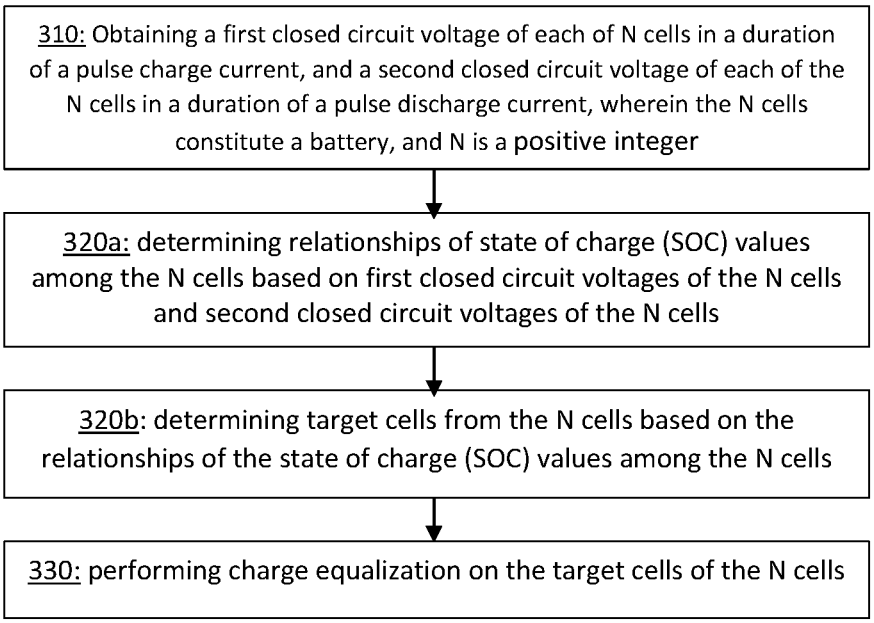
FIG. 3 shows a flowchart of a battery equalization method according to an embodiment of this application.

FIG. 3 shows a flowchart of a battery equalization method according to an embodiment of this application. Referring to FIG. 3, the method includes the following steps.

Step 310: Obtain a first closed circuit voltage of N cells in a duration of a pulse charge current and a second closed circuit voltage of the N cells in a duration of a pulse discharge current.

In this embodiment, the N cells are serial-connected to constitute a battery, where N is a positive integer.

In step 310, the first closed circuit voltage of each of the N cells in the duration of the pulse charge current and the second closed circuit voltage of the cell in the duration of the pulse discharge current are obtained. Each cell corresponds to a first closed circuit voltage and a second closed circuit voltage.

In this embodiment, the pulse charge current and the pulse discharge current mean a current that changes instantaneously and works for a short time (less than dozens of seconds), and a maximum current during the pulsing is higher than a persistent current that lasts for several minutes. The pulse charge current and the pulse discharge current are generated when the battery is in use. For example, during movement of an electric vehicle, a pulse discharge current is generated in each cell when a driver accelerates by stepping on an accelerator, and a pulse charge current is generated in each cell when the driver decelerates by stepping on a brake. During the use of the electric vehicle, pulse charging currents and pulse discharge currents are inevitably generated in each cell constantly.

It needs to be noted that the voltage across the cell measured when a current (whether persistent current or a pulse current) flows through the cell is a closed circuit voltage. The voltage across the cell measured when a pulse charge current flows through the cell is the first closed circuit voltage mentioned in the embodiment, and the voltage across the cell measured when a pulse discharge current flows through the cell is the second closed circuit voltage mentioned in this embodiment.

Step 320: Determine a relationship of SOC values between the N cells based on the first closed circuit voltage and the second closed circuit voltage.

Step 330: Perform charge equalization on target cells, where the target cells are determined from the N cells based on the relationship of SOC values.

In step 320, the relationship of SOC values between the N cells is determined based on the first closed circuit voltage and the second closed circuit voltage of each cell without a need to calculate the specific value of SOC. The relationship of SOC values between the N cells may be a SOC ranking of all cells, may be the largest M SOC values determined from the SOC values of the N cells, or may be the smallest L SOC values determined from the SOC values of the N cells, or may be the largest M SOC values and the smallest L SOC values determined from the SOC values of the N cells. The largest M SOC values mean the M SOC values ranked in the first M places in the SOC values of the N cells ranked in descending order. The smallest L SOC values mean the L SOC values ranked in the last L places in the SOC values of the N cells ranked in descending order.

The difference in the open circuit voltage is very small between the cells of different SOC values. Therefore, the SOC of a cell estimated by using the open circuit voltage is not precise at all. However, when a current exists, the closed circuit voltage may differ greatly between the cells. Therefore, the relationship of SOC values between any two cells in the battery can be determined based on such difference. However, this embodiment does not simply use the closed circuit voltage in the case of a persistent current or the closed circuit voltage in the case of a pulse current to determine the relationship of SOC values, but determines the relationship of SOC values between any two cells based on both the first closed circuit voltage at the time of pulse charge and the second closed circuit voltage at the time of pulse discharge. In step 320, by comparing the first closed circuit voltage and the second closed circuit voltage between any two cells, the relationship of SOC values between any two cells can be obtained, and then the relationship of SOC values between the N cells can be obtained.

A manner of determining the relationship of SOC values between any two cells includes: determining, if the first closed circuit voltage of a first cell in two cells is greater than the first closed circuit voltage of a second cell in the two cells, and the second closed circuit voltage of the first cell is also greater than the second closed circuit voltage of the second cell, that a SOC value of the first cell is greater than a SOC value of the second cell.

The following describes principles of the foregoing implementation:

Understandably, when the relationship of SOC values is determined by using the closed circuit voltage, the direct-current internal resistance of the cells may exert an impact. Each cell may inherently have a different internal resistance or the difference in the internal resistance is caused by temperature inconsistency during use. The inconsistency of the direct-current internal resistance interferes with the measurement of the closed circuit voltage. For example, when a pulse charge current appears, a high-SOC cell will exhibit an obviously high closed circuit voltage, but a high-internal-resistance cell will also exhibit an obviously high closed circuit voltage, thereby interfering in determining the relationship of SOC values. Based on the pulse charge current and the pulse discharge current generated by the electric vehicle in use, if the difference in the internal resistance interferes in determining the relationship of SOC values, the first closed circuit voltage corresponding to the high-internal-resistance cell during pulse charge will be relatively high, and the corresponding second closed circuit voltage during pulse discharge will be relatively low. If merely the difference in SOC is used as a basis for determining, both the first closed circuit voltage and the second closed circuit voltage of a high-SOC cell are relatively high. Therefore, by collecting the first closed circuit voltage at the time of pulse charge and the second closed circuit voltage at the time of pulse discharge and making a comparison with the first closed circuit voltage and the second closed circuit voltage of other cells, the interference of the internal resistance on the SOC can be precluded, and a high-SOC cell and a low-SOC cell in two cells can be identified.

In this embodiment, a time interval between the pulse charge current and the pulse discharge current is not strictly limited. For example, a pulse charge current that occurs at a time and a nearest pulse discharge current that is less than one hour distant from the pulse charge current may constitute a condition for determining. The relationship of SOC values between the cells may be determined based on the first closed circuit voltage of each cell in the case of such pulse charge current and the second closed circuit voltage of the cell in the case of such pulse discharge current.

The smaller the time interval, the lower the interference. Therefore, the foregoing method may be implemented based on a pulse charge current and a pulse discharge current that are adjacent to each other. Alternatively, the method may be implemented based on a pulse charge current of the largest charge current value and a pulse discharge current of the largest discharge current value.

In an embodiment, in step 310, the first closed circuit voltage of each of the N cells in a duration of a latest pulse charge current and the second closed circuit voltage of the cell in a duration of a latest pulse discharge current are obtained.

In an embodiment, in step 310, a target pulse charge current of a largest charge current value and a target pulse discharge current of a largest discharge current value are determined among latest j pulse charge currents and latest k pulse discharge currents; and the first closed circuit voltage of each of the N cells in a duration of the target pulse charge current and the second closed circuit voltage of the cell in a duration of the target pulse discharge current are obtained.

In the foregoing embodiment, the pulse charge current of the largest current value and the pulse discharge current of the largest current value are selected. Therefore, in a case of a high current value, the difference of the closed circuit voltage between different cells can be amplified, so that it is easier to identify the relationship of SOC values between the cells.

It needs to be noted that the pulse charge current and the pulse discharge current mentioned in this embodiment are not necessarily adjacent, and other pulse currents may exist between the pulse charge current and the pulse discharge current, but the charge equalization is not effective on the cell between the pulse charge current and the pulse discharge current. This will exert an impact on determining the relationship of SOC values.

In some embodiments, in step 320, the relationship of SOC values between the N cells is determined in the following manner:

Manner 1: M SOC values are determined from the SOC values of N cells based on the first closed circuit voltage and the second closed circuit voltage of each cell. The M SOC values are not less than any of remaining SOC values other than the M SOC values in the SOC values of the N cells.

In Manner 1, the largest M SOC values are determined from the SOC values of the N cells based on the first closed circuit voltage and the second closed circuit voltage of each cell, where M is a positive integer and M is less than N.

If M is equal to 1, a largest SOC value is determined from the SOC values of the N cells based on the first closed circuit voltage and the second closed circuit voltage of each cell.

If M is greater than 1, an embodiment is as follows:

A. A largest SOC value is determined from the SOC values of the N cells based on the first closed circuit voltage and the second closed circuit voltage of each of the N cells. A specific implementation may be as follows:

A cell is randomly selected from the N cells, and is used as a target cell. A cell is randomly selected from the remaining cells that have not been used for comparison and that are different from the target cell among the N cells, and is used as a to-be-compared cell. The first closed circuit voltage of the target cell is compared with the first closed circuit voltage of the to-be-compared cell, and the second closed circuit voltage of the target cell is compared with the second closed circuit voltage of the to-be-compared cell. If the first closed circuit voltage of the to-be-compared cell is greater than the first closed circuit voltage of the target cell, and the second closed circuit voltage of the to-be-compared cell is also greater than the second closed circuit voltage of the target cell, it is determined that the SOC value of the to-be-compared cell is greater than the SOC value of the target cell. A cell of a larger SOC value compared among the two cells is used as a target cell in a next round of comparison. A cell is selected from the remaining cells that have not been used for comparison among the N cells, and is used as a to-be-compared cell in the next round of comparison. The first closed circuit voltage of the target cell in the next round of comparison is compared with the first closed circuit voltage of the to-be-compared cell in the next round of comparison, and the second closed circuit voltage of the target cell in the next round of comparison is compared with the second closed circuit voltage of the to-be-compared cell in the next round of comparison to determine the relationship of SOC values between the target cell in the next round of comparison and the to-be-compared cell in the next round of comparison. A cell of a larger SOC value compared among the two cells is used as a target cell in a next round of comparison. The foregoing step of comparing the first closed circuit voltage and the second closed circuit voltage between the two cells is performed iteratively. After all the cells have been compared, a final target cell is determined. The SOC value of this target cell is the largest, so that a largest SOC value is determined from the SOC values of the N cells.

B. After the largest SOC value is determined from the SOC values of the N cells, the remaining cells other than the cell corresponding to the determined largest SOC value are determined among the N cells. A largest SOC value is determined from the SOC values of the remaining cells based on the first closed circuit voltage and the second closed circuit voltage of each of the remaining cells.

The manner of determining a largest SOC value from the SOC values of the remaining cells is the same as step A, and is to perform the step of comparing the first closed circuit voltage and the second closed circuit voltage between the two cells iteratively to determine the cell of a larger SOC value. The two closed circuit voltages of the cell of a larger SOC value are iteratively compared with the two closed circuit voltages of other not-yet-compared cells until a largest SOC value is finally determined.

A largest SOC value is determined from the SOC values of the remaining cells iteratively in the foregoing manner until the largest M SOC values are determined among the SOC values of the N cells. Understandably, the remaining cell changes constantly with the determined largest SOC value.

The M cells corresponding to the determined M SOC values are the cells of relatively high SOC values among the N cells. In step 330, the corresponding M cells are used as target cells, and passive equalization is performed on the M cells.

In an embodiment, step 330 includes: performing equalization on the target cells in a preset amount of charge. The preset amount of charge is a relatively small SOC value. For example, the preset amount of charge falls in a range of 0.1% to 1% of a nominal capacity of any cell. Certainly, in practical applications, the preset amount of charge may be less than 0.1% or greater than 1%.

Passive equalization generally means a process of discharging a cell of a relatively high SOC value by using a discharge resistor, so as to release electrical charge in the form of heat and make the remaining charge as consistent as practicable between N cells. Discharge amounts of the M cells are preset, thereby ensuring that the remaining charge is as consistent as practicable between the N cells when a precise SOC value of each cell is not available. The preset amount of charge is a relatively small SOC value. By progressively discharging the cell in small amounts iteratively, it is ensured that the cell will not be discharged excessively at a time, and that the remaining charge will not be unequal again between the N cells.

The preset amounts of charge corresponding to the M cells may be the same or may decrease stepwise.

If M SOC values are determined in the foregoing manner, the relative relationship of the M SOC values is learned, and a SOC value determined first is larger than a SOC value determined later. For example, the relationship of the M SOC values is: SOC of a cell 3>SOC of a cell 5>SOC of a cell 2>SOC of a cell 1>SOC of a cell 4. Then, in step 330, the cells 1 to 5 may be discharged in stepwise amounts of charge. The discharge amounts are ranked as: a discharge amount of the cell 3>a discharge amount of the cell 5>a discharge amount of the cell 2>a discharge amount of the cell 1>a discharge amount of the cell 4. Nevertheless, this embodiment does not precisely calculate a specific value of SOC, and cannot accurately give the most suitable amount of charge to be discharged from each cell. Therefore, all the discharge amounts of the M cells are preset. The preset discharge amounts of the M cells are S1, S2, . . . , and SM, where S1>S2> . . . >SM. The cell corresponding to the largest SOC value among the M SOC values is discharged in an amount of 51, and the cell corresponding to the smallest SOC value among the M SOC values is discharged in an amount of SM.

In some embodiments, M SOC values may be determined in other ways. In such embodiments, it is sufficient to determine the largest M SOC values from the SOC values of the N cells, without a need to care about the relative relationship of the M SOC values. In step 330, the M cells corresponding to the M SOC values may be discharged in the same amount.

Manner 2: L SOC values are determined from the SOC values of N cells based on the first closed circuit voltage and the second closed circuit voltage of each cell. The L SOC values are not greater than any of remaining SOC values other than the L SOC values in the SOC values of the N cells.

In Manner 2, the smallest L SOC values are determined from the SOC values of the N cells based on the first closed circuit voltage and the second closed circuit voltage of each cell, where L is a positive integer and L is less than N.

If L is equal to 1, a smallest SOC value is determined from the SOC values of the N cells based on the first closed circuit voltage and the second closed circuit voltage of each cell.

The process of comparing the first closed circuit voltage and the second closed circuit voltage between the two cells is performed iteratively to determine the cell of a smaller SOC value continuously. The first closed circuit voltage and the second closed circuit voltage of the cell of a smaller SOC value are iteratively compared with the first closed circuit voltage and the second closed circuit voltage of other not-yet-compared cells until a smallest SOC value is finally determined.

If L is greater than 1, a smallest SOC value is determined from the SOC values of the N cells first. Then a smallest SOC value is determined from the SOC values of the remaining cells iteratively until the smallest L SOC values are determined among the SOC values of the N cells.

The detailed implementation of Manner 2 is omitted here, and may be obtained by referring to Manner 1.

Manner 3: M SOC values are determined from the SOC values of the N cells based on the first closed circuit voltage and the second closed circuit voltage of each cell, and L SOC values are determined from the SOC values of the N cells based on the first closed circuit voltage and the second closed circuit voltage of each cell. The M SOC values are not less than any of remaining SOC values other than the M SOC values among the SOC values of the N cells, and the L SOC values are not greater than any of remaining SOC values other than the L SOC values among the SOC values of the N cells.

For the implementation of determining the M SOC values from the SOC values of the N cells, reference may be made to Manner 1; and, for the implementation of determining the L SOC values from the SOC values of the N cells, reference may be made to Manner 2, details of which are omitted here.

Manner 4: A SOC ranking of the N cells is determined based on the first closed circuit voltage and the second closed circuit voltage of each cell.

In Manner 4, the SOC ranking of the N cells needs to be determined. The SOC ranking indicates a relationship of SOC values between all the N cells.

In a specific implementation of Manner 4, still the first closed circuit voltage and the second closed circuit voltage of any two cells are compared to determine the relationship of SOC values between any two cells. The foregoing step is performed iteratively. After the relationship of SOC values between any two of the N cells is obtained, the SOC ranking of the N cells is obtained.

If the SOC ranking of the N cells is obtained, cells that meet a condition may be selected from the N cells based on the SOC ranking, and may be used as target cells. For example, the M cells corresponding to M SOC values ranked ahead in the SOC ranking may be used as the target cells, or the L cells corresponding to L SOC values ranked behind in the SOC ranking may be used as the target cells, or the M cells corresponding to the M SOC values ranked ahead in the SOC ranking and the L cells corresponding to the L SOC values ranked behind in the SOC ranking may be used together as the target cells.

After the SOC ranking of the N cells is determined, step 330 includes the following implementations:

(1) Selecting the M cells corresponding to the M SOC values ranked ahead in the SOC ranking as the target cells, and performing passive equalization on the target cells, that is, discharging the M cells;

(2) Selecting the L cells corresponding to the L SOC values ranked behind in the SOC ranking as the target cells, and performing active equalization on the target cells, that is, replenishing the M cells with electricity; and (3) Selecting the M cells corresponding to the M SOC values ranked ahead in the SOC ranking as first target cells, and selecting the L cells corresponding to the L SOC values ranked behind in the SOC ranking as second target cells, performing passive equalization on the first target cells, and performing active equalization on the second target cells.

Understandably, in Manners 1, 2, 3, and 4 above, the following circumstance may occur: the SOC relationship between two of the N cells cannot be learned, for example, the first closed circuit voltage of the cell 1 is greater than the first closed circuit voltage of the cell 2 but the second closed circuit voltage of the cell 1 is not greater than the second closed circuit voltage of the cell 2, which cannot satisfy the determining condition that both the first closed circuit voltage and the second closed circuit voltage of one of the cells are greater than the first closed circuit voltage and the second closed circuit voltage of the other cell, and makes it impracticable to determine the relationship of SOC values between the cell 1 and the cell 2. Therefore, the determining of the relationship of SOC values between the N cells on this occasion may be abandoned, and the charge equalization is not performed in this circumstance. After a period of wait time elapses or after other trigger conditions are satisfied, steps 310 to 330 are performed again.

Understandably, the pulse charge current and the pulse discharge current continue for a short duration. The first closed circuit voltage may be an instantaneous voltage or an average voltage within the duration of the pulse charge current. Similarly, the second closed circuit voltage may be an instantaneous voltage or an average voltage within the duration of the pulse discharge current. In an embodiment, the first closed circuit voltage is a highest voltage of the cell within the duration of the pulse charge current, and the second closed circuit voltage is a lowest voltage of the cell within the duration of the pulse discharge current. The highest voltage and the lowest voltage are a peak voltage during pulse charge and a peak voltage during pulse discharge, respectively. The peak voltages are used for comparison, thereby further amplifying the voltage difference between the cells, and then amplifying the SOC difference between the cells, and making it easier to identify the relationship of SOC values.

In some embodiments, step 310 includes: obtaining, when a trigger condition is satisfied, the first closed circuit voltage of the N cells in the duration of the pulse charge current and the second closed circuit voltage of the N cells in the duration of the pulse discharge current.

The trigger condition includes at least one of the following conditions:

a. A preset duration has passed since a previous charge equalization process.

Steps 310 to 330 are performed periodically. For example, when it is detected that 10 minutes have passed since the previous charge equalization process, the first closed circuit voltage corresponding to the latest pulse charge current of the N cells and the second closed circuit voltage corresponding to the latest pulse discharge current are obtained. Alternatively, the first closed circuit voltage corresponding to the pulse charge current of the largest current value among the latest j pulse charge currents of the N cells, and the second closed circuit voltage corresponding to the pulse discharge current of the largest current value among the latest k pulse discharge currents, are obtained. The relationship of SOC values between the N cells is identified based on the obtained first closed circuit voltage and second closed circuit, and then charge equalization is performed on the corresponding target cells based on the relationship of SOC values.

b. A pulse charge current and a pulse discharge current appear consecutively.

Once a pulse charge current and a pulse discharge current that are continuous are detected, steps 310 to 330 are performed.

c. The pulse charge current and the pulse discharge current appear in a preset time interval.

Once two opposite pulse currents are detected in a time interval, steps 310 to 330 are performed.

In this embodiment, the trigger condition may be one or two of the foregoing conditions. For example, the trigger condition may be set to condition a and condition b. When the preset duration has passed since the previous charge equalization process, steps 310 to 330 are performed. When a pulse charge current and a pulse discharge current that occur continuously are detected again, steps 310 to 330 are performed again. The two conditions do not conflict. Alternatively, condition a and condition c may be set as the trigger condition. Condition a merely uses a time length distant from the previous charge equalization process as a trigger condition, and condition c uses how often the pulse current appears in the time interval as a trigger condition. The two conditions do not conflict.

The battery equalization method according to this embodiment is applicable to any type of lithium-ion battery, including but not limited to a lithium-ion battery with a positive electrode material made from lithium iron phosphate, lithium vanadium phosphate, or lithium manganese iron phosphate. Therefore, the type of the lithium-ion battery does not constitute a limitation on this embodiment.

It needs to be noted that for any two cells in a lithium-ion battery (for example, with a positive electrode material made from lithium iron phosphate), in the case that the relationship of SOC values between the two cells is not known, if the SOC values are compared between the two cells merely by comparing a single closed circuit voltage at the time of pulse charge or pulse discharge, a misjudgment may occur due to interference from the direct-current internal resistance of the cell.

Table 1 below shows relevant parameters for determining a SOC relationship based on merely the first closed circuit voltage at the time of pulse charge. It is assumed that two cells exist, that is, a cell A and a cell B. An initial voltage of both cells before occurrence of pulse charge is 3.249 volts (V). After pulse charge occurs (the pulse charge current is 176 amperes (A)), the first closed circuit voltage of the cell A is 3.436 V, and the first closed circuit voltage of the cell B is 3.438 V. If the SOC relationship is determined merely based on the first closed circuit voltage, because the first closed circuit voltage of the cell B is higher than the first closed circuit voltage of the cell A, it will be determined that the SOC value of the cell B is greater than the SOC value of the cell A. However, as can be learned from actual precise measurement of the SOC values of the two cells, the actual SOC value of the cell A is 42%, and the actual SOC value of the cell B is 40%. That is, a misjudgment occurs. The reason for the misjudgment is that the direct-current internal resistance of the cell A is lower than the direct-current internal resistance of the cell B.

TABLE 1

|   | Actual SOC | Initial voltage (V) | Pulse charge current (A) | First closed circuit voltage (V) | Direct-current internal resistance (mOhm) |
|---|---|---|---|---|---|
| Cell A | 42% | 3.249 | 176 | 3.436 | 0.849 |
| Cell B | 40% | 3.249 | 176 | 3.438 | 0.943 |

Table 2 below shows relevant parameters for determining a SOC relationship based on merely the second closed circuit voltage at the time of pulse discharge. It is assumed that two cells exist, that is, a cell C and a cell D. An initial voltage of both cells before occurrence of pulse discharge is 3.290 V. After pulse discharge occurs (the pulse discharge current is 264 A), the second closed circuit voltage of the cell C is 3.013 V, and the second closed circuit voltage of the cell D is 3.019 V. If the SOC relationship is determined merely based on the second closed circuit voltage, because the second closed circuit voltage of the cell D is higher than the second closed circuit voltage of the cell C, it will be determined that the SOC value of the cell D is greater than the SOC value of the cell C. However, as can be learned from actual precise measurement of the SOC values of the two cells, the actual SOC value of the cell C is 42%, and the actual SOC value of the cell D is 40%. That is, a misjudgment occurs. The reason for the misjudgment is that the direct-current internal resistance of the cell C is higher than the direct-current internal resistance of the cell D.

TABLE 2

|   | Actual SOC | Initial voltage (V) | Pulse discharge current (A) | Second closed circuit voltage (V) | Direct-current internal resistance (mOhm) |
|---|---|---|---|---|---|
| Cell C | 42% | 3.290 | 264 | 3.013 | 0.946 |
| Cell D | 40% | 3.290 | 264 | 3.019 | 0.854 |

Table 3 below shows relevant parameters for determining a SOC relationship based on the first closed circuit voltage at the time of pulse charge and the second closed circuit voltage at the time of pulse discharge. It is assumed that three cells exist, that is, a cell E, a cell F, and a cell G. As can be seen from Table 3, the first closed circuit voltage of the cell E at the time of pulse charge is 3.436 V, the second closed circuit voltage of the cell E at the time of pulse discharge is 3.024 V, the first closed circuit voltage of the cell F at the time of pulse charge is 3.441 V, and the second closed circuit voltage of the cell F at the time of pulse discharge is 3.028 V. In this case, the first closed circuit voltage of the cell F is higher than the first closed circuit voltage of the cell E, and the second closed circuit voltage of the cell F is also higher than the second closed circuit voltage of the cell E. Therefore, the impact from the direct-current internal resistance is precluded, and it is determined that the SOC value of the cell F is higher than the SOC value of the cell E.

In addition, as can be seen from Table 3, the actual SOC value of the cell G is 42%. If the SOC relationship is determined based on merely the second closed circuit voltage at the time of pulse discharge, it will be found that the second closed circuit voltage (3.019 V) of the cell G is less than the second closed circuit voltage (3.024 V) of the cell E, and it is thereby determined that the SOC value of the cell G is lower than the SOC value of the cell E, which is a misjudgment. However, by using the determining method according to this embodiment of this application, both the first closed circuit voltage and the second closed circuit voltage are compared between the two cells, it is found that the second closed circuit voltage of the cell G is lower than the second closed circuit voltage of the cell E, but the first closed circuit voltage of the cell G is higher than the first closed circuit voltage of the cell E, which does not meet the condition that both the first closed circuit voltage and the second closed circuit voltage are higher or both are lower. Therefore, no relationship of SOC values between the cell G and the cell E is concluded. In this case, the determining of the relationship of SOC values between the cell E and the cell G may be abandoned. This method will not cause misjudgment.

TABLE 3

|   | Actual SOC | Voltage before pulse discharge (V) | Second closed circuit voltage (V) | Voltage before pulse charge (V) | First closed circuit voltage (V) | Direct-current internal resistance (mOhm) |
|---|---|---|---|---|---|---|
| Cell E | 40% | 3.290 | 3.024 | 3.249 | 3.436 | 0.846 |
| Cell F | 42% | 3.292 | 3.028 | 3.254 | 3.441 | 0.854 |
| Cell G | 42% | 3.290 | 3.019 | 3.257 | 3.447 | 0.967 |

In conclusion, by using the battery equalization method according to this embodiment of this application, the relationship of SOC values between the cells is obtained through comparison of the first closed circuit voltage and the second closed circuit voltage between the N cells that constitute the battery. An absolute SOC value of each cell does not need to be obtained precisely, and a specific percentage of SOC difference between the cells does not need to be obtained, thereby making it easier to determine the SOC value and reducing complexity of battery management.

In addition, it is sufficient to identify one or more cells with a relatively high SOC value among the N cells based on the relationship of SOC values, and/or identify one or more cells with a relatively low SOC value, and to equalize the identified cells in a preset small amount of charge. After the equalization, the relationship of SOC values is determined again, and the equalization is performed again. Efficient charge equalization is implemented on the battery by determining the SOC relationship iteratively and performing equalization in small amounts of charge iteratively.

Figure 4:
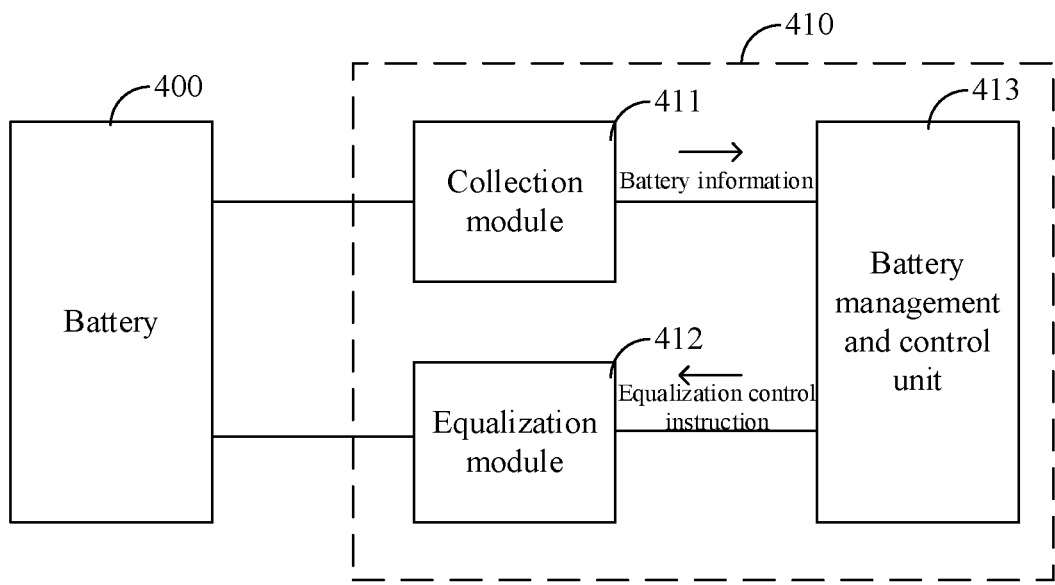
FIG. 4 shows a schematic diagram of a battery management system according to an embodiment of this application.
Figure 5:
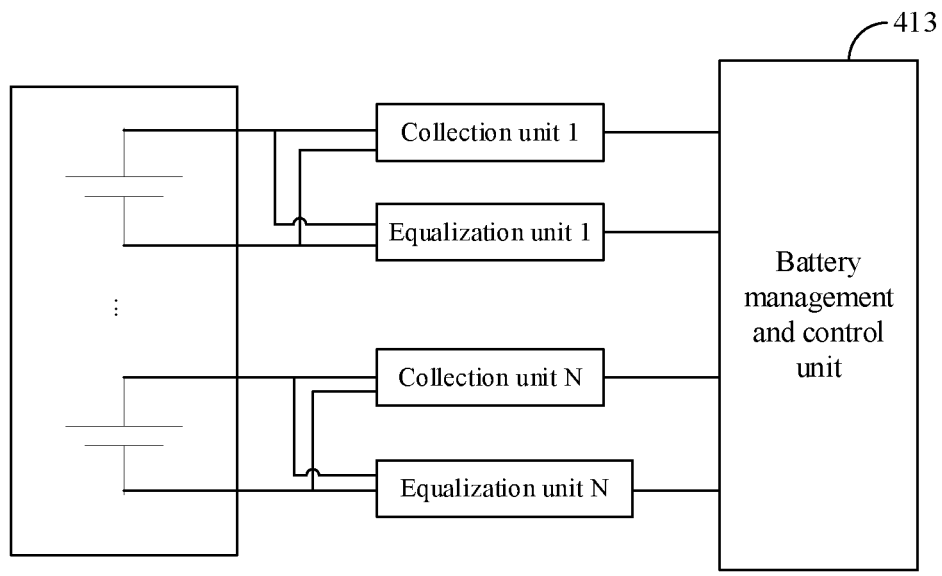
FIG. 5 shows another schematic diagram of a battery management system according to an embodiment of this application.

An embodiment of this application provides a battery management system, configured to manage a battery, where the battery includes N cells. Referring to FIG. 4 to FIG. 5, the battery management system 410 includes: a battery management and control unit 413, a collection module 411, and an equalization module 412. The collection module 411 is configured to collect battery information of a battery 400, for example, collect current values of a pulse charge current and a pulse discharge current that appear in the battery 400, and collect a first closed circuit voltage and a second closed circuit voltage across each cell in the battery 400. The collection module 411 provides the collected battery information to the battery management and control unit 413. The battery management and control unit 413 is configured to perform equalization control on corresponding cells in the battery 400 based on the battery information provided by the collection module 411. The equalization module 412 is configured to receive an equalization control instruction from the battery management and control unit 413, and perform charge equalization on the corresponding cells.

The collection module 411 includes a plurality of collection units. Each collection unit is configured to collect a first closed circuit voltage of a corresponding cell in a battery in a duration of a pulse charge current, and a second closed circuit voltage of the cell in a duration of a pulse discharge current. The battery management and control unit 413 obtains the first closed circuit voltage and the second closed circuit voltage of each cell based on the information collected by the plurality of collection units.

The battery management and control unit 413 is configured to determine a relationship of SOC values between the N cells based on the first closed circuit voltage and the second closed circuit voltage of each cell, and perform charge equalization on target cells based on the relationship of SOC values, where the target cells are determined from the N cells based on the relationship of SOC values.

The equalization module 412 includes a plurality of equalization units. Each equalization unit is configured to perform charge equalization on a corresponding cell in the battery. The equalization unit is configured to receive an equalization control instruction sent by the battery management and control unit 413, and perform charge equalization on the corresponding cells.

If the battery management and control unit 413 merely performs passive equalization on the target cells of a relatively high SOC value based on the relationship of SOC values, all the plurality of equalization units are passive equalization units. If the battery management and control unit 413 merely performs active equalization on the target cells of a relatively low SOC value based on the relationship of SOC values, all the plurality of equalization units are active equalization units.

Certainly, each equalization unit may include both a passive equalization unit and an active equalization unit. The passive equalization unit is configured to discharge a corresponding cell based on the equalization control instruction of the battery management and control unit 413 when the SOC value of the cell is relatively high. The active equalization unit is configured to replenish the corresponding cell with electricity based on the equalization control instruction of the battery management and control unit 413 when the SOC value of the cell is relatively low.

The battery management and control unit 413 is connected to each collection unit and each equalization unit. The battery management and control unit 413 is configured to perform the battery equalization method provided in the foregoing embodiment. For brevity, the specific steps of the method are omitted here and reference may be made to the preceding method embodiment.

An embodiment of this application provides an electric vehicle. The foregoing battery management system is installed in the electric vehicle.

Figure 6:
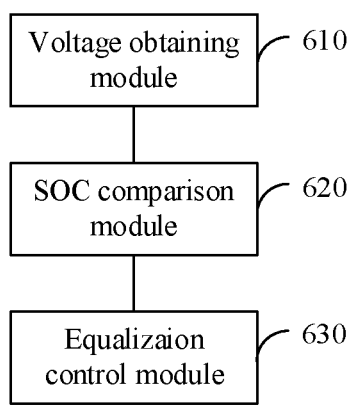
FIG. 6 shows a schematic diagram of a battery equalization device according to an embodiment of this application.

An embodiment of this application provides a battery equalization device. Referring to FIG. 6, the device includes a voltage obtaining module 610, a SOC comparison module 620, and an equalization control module 630.

The voltage obtaining module 610 is configured to obtain a first closed circuit voltage of N cells in a duration of a pulse charge current and a second closed circuit voltage of the N cells in a duration of a pulse discharge current, where the N cells constitute a battery, and N is a positive integer.

The SOC comparison module 620 is configured to determine a relationship of SOC values between the N cells based on the first closed circuit voltage and the second closed circuit voltage.

The equalization control module 630 is configured to perform charge equalization on target cells, where the target cells are determined from the N cells based on the relationship of SOC values.

In some embodiments, a manner in which the SOC comparison module 620 determines the relationship of SOC values between any two cells includes: determining, if the first closed circuit voltage of a first cell in two cells is greater than the first closed circuit voltage of a second cell in the two cells, and the second closed circuit voltage of the first cell is also greater than the second closed circuit voltage of the second cell, that a SOC value of the first cell is greater than a SOC value of the second cell.

In some embodiments, the SOC comparison module 620 is specifically configured to:

determine M SOC values from the SOC values of the N cells based on the first closed circuit voltage and the second closed circuit voltage of each cell, where the M SOC values are not less than any of remaining SOC values other than the M SOC values in the SOC values of the N cells, and the target cells include the M cells corresponding to the M SOC values; and/or determine L SOC values from the SOC values of the N cells based on the first closed circuit voltage and the second closed circuit voltage of each cell, where the L SOC values are not greater than any of remaining SOC values other than the L SOC values in the SOC values of the N cells, and the target cells include the L cells corresponding to the L SOC values.

M and L are positive integers, M is less than N, and L is less than N.

In some embodiments, the SOC comparison module 620 is specifically configured to: determine a SOC ranking of the N cells based on the first closed circuit voltage and the second closed circuit voltage of each cell. The target cells include: M cells corresponding to the M SOC values that are ranked first in the SOC ranking and/or L cells corresponding to the L SOC values that are ranked last in the SOC ranking.

In some embodiments, the equalization control module 630 is specifically configured to perform equalization on the target cells in a preset amount of charge.

In some embodiments, the voltage obtaining module 610 is specifically configured to obtain, when a trigger condition is satisfied, the first closed circuit voltage of the N cells in the duration of the pulse charge current and the second closed circuit voltage of the N cells in the duration of the pulse discharge current.

The trigger condition includes at least one of the following conditions:
a preset duration has passed since a previous charge equalization process;
a pulse charge current and a pulse discharge current appear consecutively;
and the pulse charge current and the pulse discharge current appear in a preset time interval.

In some embodiments, the voltage obtaining module 610 is specifically configured to obtain the first closed circuit voltage of each cell in the duration of a latest pulse charge current and the second closed circuit voltage of the cell in the duration of a latest pulse discharge current.

In some embodiments, the voltage obtaining module 610 is specifically configured to: determine a target pulse charge current of a largest charge current value and a target pulse discharge current of a largest discharge current value among latest j pulse charge currents and latest k pulse discharge currents; and obtain the first closed circuit voltage of each cell in a duration of the target pulse charge current and the second closed circuit voltage of the cell in a duration of the target pulse discharge current.

In some embodiments, the first closed circuit voltage is a highest voltage of the cells in the duration of the pulse charge current, and the second closed circuit voltage is a lowest voltage of the cells in the duration of the pulse discharge current.

The implementation principles and technical effects of the battery equalization device according to this embodiment of this application have been described in the foregoing method embodiment. For brevity, the content not mentioned in the device embodiment may be obtained by referring to the corresponding content in the method embodiment.

Although this application has been described with reference to optional embodiments, various improvements may be made to the embodiments without departing from the scope of this application, and the components therein may be replaced with equivalents. Particularly, to the extent that no structural conflict exists, various technical features mentioned in various embodiments can be combined in any manner. This application is not limited to the specific embodiments disclosed herein, but includes all technical solutions falling within the scope of the claims.

What is claims is:

1. A battery equalization method, comprising:
obtaining a first closed circuit voltage of each of N cells in a duration of a pulse charge current, and a second closed circuit voltage of each of the N cells in a duration of a pulse discharge current, wherein the N cells constitute a battery, and N is a positive integer;
determining relationships of state of charge (SOC) values among the N cells based on the first closed circuit voltages of the N cells and the second closed circuit voltages of the N cells;
determining target cells from the N cells iteratively based on the relationships of the state of charge (SOC) values among the N cells; and
performing charge equalization on the target cells of the N cells; and, wherein the first closed circuit voltage is a highest voltage of each of the N cells in the duration of the pulse charge current, and the second closed circuit voltage is a lowest voltage of each of the N cells in the duration of the pulse discharge current,
wherein determining the relationships of SOC values among the N cells further comprise:
randomly selecting a first cell from the N cells as a reference cell;
randomly selecting a second cell from the remaining of the N cells as a to-be-compared cell;
until a quantity of the remaining to-be-compared cells of the N cells becomes zero, performing:
comparing the first and second closed circuit voltages of the reference cell with the first and second closed circuit voltages of the to-be-compared cell;
when the first and second closed circuit voltages of the to-be-compared cell are greater than the first and second closed circuit voltages of the reference cell:
making the to-be-compared cell as the reference cell; and
setting the reference cell as an already-compared cell;
when the first and/or second closed circuit voltages of the to-be-compared cell is not greater than the first and/or second closed circuit voltages of the reference cell:
setting the to-be-compared cell as the already-compared cell;
randomly selecting another cell from the remaining to-be-compared cells of the N cells as the to-be-compared cell.

2. The battery equalization method according to claim 1, wherein determining the target cells from the N cells further comprises:
determining M target cells from the N cells based on the SOC values of the N cells, wherein M<N;
wherein a lowest SOC value of one of the M target cells is greater than or equal to a highest SOC value of a non-target cell of the N cells.

3. The battery equalization method according to claim 1, wherein determining the target cells from the N cells further comprises:
determining a SOC value ranking of the N cells based on the first closed circuit voltage of each of the N cells and the second closed circuit voltage of each of the N cells cell based on the relationships of SOC values among the N cells; and
determining M target cells from the N cells based on the SOC value ranking of the N cells, wherein M<N;
wherein the SOC values of the M target cells of the N cells are ranked highest in the SOC value ranking of the N cells, or
wherein the SOC values of the M target cells of the N cells are ranked lowest in the SOC value ranking of the N cells.

4. The method battery equalization according to claim 1, wherein performing the charge equalization on the target cells of the N cells comprises:
performing equalization on the target cells of the N cells by a preset amount of charge.

5. The battery equalization method according to claim 1, wherein obtaining the first closed circuit voltage of each of N cells in a duration of a pulse charge current, and the second closed circuit voltage of each of the N cells in a duration of a pulse discharge current comprises:
obtaining, when a trigger condition is satisfied, the first closed circuit voltage of each of the N cells in the duration of the pulse charge current, and the second closed circuit voltage of each of the N cells in the duration of the pulse discharge current, wherein the trigger condition comprises at least one of the following conditions:
- a preset duration has passed since a previous charge equalization process;
- a pulse charge current and a pulse discharge current appear consecutively; and
- the pulse charge current and the pulse discharge current appear in a preset time interval.

6. The battery equalization method according to claim 1, wherein obtaining the first closed circuit voltage of each of N cells in a duration of a pulse charge current, and the second closed circuit voltage of each of the N cells in a duration of a pulse discharge current comprises:
- obtaining a first closed circuit voltage of each cell in a duration of a latest pulse charge current, and a second closed circuit voltage of the cell in a duration of a latest pulse discharge current.

7. The battery equalization method according to claim 1, wherein obtaining the first closed circuit voltage of each of N cells in a duration of a pulse charge current, and the second closed circuit voltage of each of the N cells in a duration of a pulse discharge current comprises:
- determining a target pulse charge current of a largest charge current value and a target pulse discharge current of a largest discharge current value among latest j pulse charge currents and latest k pulse discharge currents; and
- obtaining the first closed circuit voltage of each cell in a duration of the target pulse charge current and the second closed circuit voltage of the cell in a duration of the target pulse discharge current.

8. The battery equalization method according to claim 1, wherein determining the target cells from the N cells further comprises:
- determining L target cells from the N cells based on the SOC values of the N cells, wherein L<N;
- wherein a highest SOC value of a target cell is less than or equal to a lowest SOC value of a non-target cell of the N cells.

9. A battery equalization device, comprising:
- a voltage obtaining module, configured to obtain a first closed circuit voltage of each of N cells in a duration of a pulse charge current, and a second closed circuit voltage of each of the N cells in a duration of a pulse discharge current, wherein the N cells constitute a battery, and N is a positive integer;
- a SOC comparison module, configured to determine relationships of state of charge (SOC) values among the N cells based on first closed circuit voltages of the N cells and second closed circuit voltages of the N cells, wherein determining the relationships of the SOC values among the N cells further comprises:
  - randomly selecting a first cell from the N cells as a reference cell;
  - randomly selecting a second cell from the remaining of the N cells as a to-be-compared cell;
  - until a quantity of the remaining to-be-compared cells of the N cells becomes zero, performing:
    - comparing the first and second closed circuit voltages of the reference cell with the first and second closed circuit voltages of the to-be-compared cell;
    - when the first and second closed circuit voltages of the to-be-compared cell are greater than the first and second closed circuit voltages of the reference cell:
      - making the to-be-compared cell as the reference cell; and
      - setting the reference cell as an already-compared cell;
    - when the first and/or second closed circuit voltages of the to-be-compared cell is not greater than the first and/or second closed circuit voltages of the reference cell:
      - setting the to-be-compared cell as the already-compared cell;
    - randomly selecting another cell from the remaining to-be-compared cells of the N cells as the to-be-compared cell; and
- an equalization control module, configured to determine target cells from the N cells iteratively based on the relationships of the state of charge (SOC) values among the N cells, and perform charge equalization on the target cells;
- wherein the first closed circuit voltage is a highest voltage of each of the N cells in the duration of the pulse charge current, and the second closed circuit voltage is a lowest voltage of each of the N cells in the duration of the pulse discharge current.

10. A battery management system, comprising:
- a plurality of collection units, each configured to collect a first closed circuit voltage of a corresponding cell in a battery of N cells in a duration of a pulse charge current, and collect a second closed circuit voltage of the cell in a duration of a pulse discharge current;
- a plurality of equalization units, each configured to perform charge equalization on a corresponding cell in the battery of N cells; and
- a battery management and control unit, connected to each collection unit and each equalization unit, and configured to perform a battery equalization method that comprises:
  - obtaining first closed circuit voltages of the N cells in a duration of a pulse charge current and second closed circuit voltages of the N cells in a duration of a pulse discharge current, wherein the N cells constitute the battery, and N is a positive integer;
  - determining relationships of state of charge (SOC) values among the N cells based on the first closed circuit voltages and the second closed circuit voltages;
  - determining target cells from the N cells iteratively based on the relationships of the state of charge (SOC) values among the N cells; and
  - performing charge equalization on the target cells;
- wherein determining the relationships of SOC values among the N cells further comprises:
  - randomly selecting a first cell from the N cells as a reference cell;
  - randomly selecting a second cell from the remaining of the N cells as a to-be-compared cell;
  - until a quantity of the remaining to-be-compared cells of the N cells becomes zero, performing:
    - comparing the first and second closed circuit voltages of the reference cell with the first and second closed circuit voltages of the to-be-compared cell;
    - when the first and second closed circuit voltages of the to-be- compared cell are greater than the first and second closed circuit voltages of the reference cell:
      - making the to-be-compared cell as the reference cell; and
      - setting the reference cell as an already-compared cell;

when the first and/or second closed circuit voltages of the to-be-compared cell is not greater than the first and/or second closed circuit voltages of the reference cell:
setting the to-be-compared cell as the already-compared cell;
randomly selecting another cell from the remaining to-be-compared cells of the N cells as the to-be-compared cell,
wherein the first closed circuit voltage is a highest voltage of each of the N cells in the duration of the pulse charge current, and the second closed circuit voltage is a lowest voltage of each of the N cells in the duration of the pulse discharge current.

* * * * *